(12) United States Patent
Fukui et al.

(10) Patent No.: US 10,109,571 B2
(45) Date of Patent: Oct. 23, 2018

(54) WIRING SUBSTRATE AND MANUFACTURING METHOD OF WIRING SUBSTRATE

(71) Applicants: FUJITSU LIMITED, Kawasaki-shi, Kanagawa (JP); SONY CORPORATION, Tokyo (JP)

(72) Inventors: Kei Fukui, Iizuna (JP); Kazuya Arai, Suzaka (JP); Koji Komemura, Nagano (JP); Kazuhiko Iijima, Kawasaki (JP); Kenichiro Abe, Nagano (JP); Shinji Rokuhara, Minato (JP); Shuichi Oka, Minato (JP)

(73) Assignees: FUJITSU LIMITED, Kawasaki (JP); SONY CORPORATION, Tokyo (JP)

( * ) Notice: Subject to any disclaimer, the term of this patent is extended or adjusted under 35 U.S.C. 154(b) by 0 days.

(21) Appl. No.: 15/278,798

(22) Filed: Sep. 28, 2016

(65) Prior Publication Data

US 2017/0103944 A1 Apr. 13, 2017

(30) Foreign Application Priority Data

Oct. 7, 2015 (JP) .................. 2015-199256

(51) Int. Cl.
*H05K 1/00* (2006.01)
*H05K 1/18* (2006.01)
(Continued)

(52) U.S. Cl.
CPC ...... *H01L 23/49838* (2013.01); *H01L 21/486* (2013.01); *H01L 21/4857* (2013.01); *H01L 21/6835* (2013.01); *H01L 23/49822* (2013.01); *H01L 23/49827* (2013.01); *H05K 1/0298* (2013.01); *H05K 1/09* (2013.01); *H05K 1/115* (2013.01); *H05K 1/144* (2013.01); *H05K 3/002* (2013.01); *H05K 3/0026* (2013.01); *H05K 3/02* (2013.01); *H05K 3/4038* (2013.01); *H05K 3/429* (2013.01); *H05K 3/4652* (2013.01); *H05K 3/4682* (2013.01); *H01L 2221/68345* (2013.01); *H01L 2221/68359* (2013.01); *H01L 2221/68386* (2013.01); *H01L 2224/16225* (2013.01);
(Continued)

(58) Field of Classification Search
USPC .......................................... 361/748; 174/257
See application file for complete search history.

(56) References Cited

U.S. PATENT DOCUMENTS

2002/0060091 A1* 5/2002 Naba ................. H01L 23/15
174/257
2003/0086248 A1* 5/2003 Mashino ............ H01L 21/486
361/767
(Continued)

FOREIGN PATENT DOCUMENTS

JP 2004-140254 5/2004
JP 2004-235323 8/2004
(Continued)

*Primary Examiner* — Andargie M Aychillhum
(74) *Attorney, Agent, or Firm* — Staas & Halsey LLP

(57) ABSTRACT

A wiring substrate includes a laminated sheet including a first conductor pattern, an inorganic dielectric layer, and a second conductor pattern. The first conductor pattern, the inorganic dielectric layer, and the second conductor pattern are laminated in this order. Also, the first conductor pattern is divided into a plurality of regions.

10 Claims, 21 Drawing Sheets

(51) Int. Cl.
*H05K 7/00* (2006.01)
*H01L 23/498* (2006.01)
*H01L 21/48* (2006.01)
*H01L 21/683* (2006.01)
*H05K 1/02* (2006.01)
*H05K 1/09* (2006.01)
*H05K 1/11* (2006.01)
*H05K 3/00* (2006.01)
*H05K 3/02* (2006.01)
*H05K 3/40* (2006.01)
*H05K 3/46* (2006.01)
*H05K 1/14* (2006.01)
*H05K 3/42* (2006.01)
*H05K 1/16* (2006.01)

(52) U.S. Cl.
CPC .... *H01L 2924/15311* (2013.01); *H05K 1/162* (2013.01); *H05K 2201/041* (2013.01); *H05K 2201/096* (2013.01); *H05K 2201/10371* (2013.01); *H05K 2203/0156* (2013.01)

(56) References Cited

U.S. PATENT DOCUMENTS

| | | |
|---|---|---|
| 2004/0211751 A1 | 10/2004 | Shuto et al. |
| 2006/0131069 A1 | 6/2006 | Shimizu et al. |
| 2007/0069363 A1 | 3/2007 | Kawabata et al. |
| 2007/0105278 A1 | 5/2007 | Kariya et al. |
| 2008/0104833 A1 | 5/2008 | Kariya et al. |
| 2008/0289865 A1 | 11/2008 | Nakamura et al. |
| 2009/0218678 A1 | 9/2009 | Kawabata et al. |
| 2010/0193227 A1 | 8/2010 | Kariya et al. |

FOREIGN PATENT DOCUMENTS

| | | |
|---|---|---|
| JP | 2005-44833 | 2/2005 |
| JP | 2006-173544 | 6/2006 |
| JP | 2007-123797 | 5/2007 |
| JP | 2012-33968 | 2/2012 |
| WO | WO 2006/016589 A1 | 2/2006 |

* cited by examiner

WIRING SUBSTRATE AND MANUFACTURING METHOD OF WIRING SUBSTRATE

CROSS-REFERENCE TO RELATED APPLICATION(S)

This application is based upon and claims the benefit of priority of the prior Japanese Patent Application No. 2015-199256, filed on Oct. 7, 2015, the entire contents of which are incorporated herein by reference.

FIELD

The embodiments discussed herein are related to a wiring substrate, and a manufacturing method of a wiring substrate.

BACKGROUND

Various types of wiring substrates are used for electronic devices such as personal computers and smartphones. Among the wiring substrates, multilayer wiring substrates manufactured by a build-up method especially have a high wiring density and can contribute to the performance improvement of the electronic devices.

In the multilayer wiring substrate, wiring layers and insulating layers are alternately laminated. In view of thinning the multilayer wiring substrate, it is preferable to thin the insulating layer. Moreover, one of the insulating layers is used as a dielectric layer for a capacitor in some cases. In this case, thinning the dielectric layer can increase the electrostatic capacitance of the capacitor.

Note that, the following documents disclose techniques related to the present application: Japanese Laid-open Patent Publication No. 2004-235323; Japanese Laid-open Patent Publication No. 2005-44833; International Patent Publication No. WO 2006/016589; Japanese Laid-open Patent Publication No. 2006-173544; Japanese Laid-open Patent Publication No. 2004-140254; Japanese Laid-open Patent Publication No. 2007-123797; and Japanese Laid-open Patent Publication No. 2012-33968.

However, thinning the dielectric layer is actually difficult due to various reasons.

For example, in the case where a prepreg in which glass fiber is impregnated with an epoxy resin is used for a dielectric layer, the thickness of the glass fiber itself becomes a factor which prevents the dielectric layer from being thinned, so that it is difficult to form a dielectric layer having a thickness of 30 μm or less.

Moreover, even in the case where an epoxy resin containing no glass fiber is used for a dielectric layer, it is difficult to insulate upper and lower wiring layers from each other with the dielectric layer, when the surface of the underlying wiring layer is rough, unless the dielectric layer is formed to have a sufficient thickness. For example, a wiring layer formed by the plating method has a surface roughness larger than 0.3 μm due to crystal grains. Therefore, unless a dielectric layer is formed to be thicker than 10 μm for safety, there is a possibility that upper and lower neighboring wiring layers cannot be insulated from each other with the dielectric layer.

SUMMARY

According to one aspect discussed herein, there is provided a wiring substrate including a laminated sheet including a first conductor pattern, an inorganic dielectric layer, and a second conductor pattern being laminated in this order, wherein the first conductor pattern is divided into a plurality of regions.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

A manufacturing method of a wiring substrate according to the present embodiments will be described with reference to the accompany drawings.

First Embodiment

FIGS. 1A to 1Z and 2A to 2C are cross-sectional views of a wiring substrate in the course of manufacturing thereof according to a first embodiment.

Figure 1A:
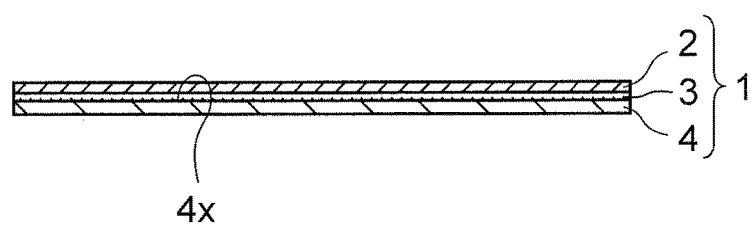
FIGS. 1A to 1Z and 2A to 2C are cross-sectional views of a wiring substrate in the course of manufacturing thereof according to a first embodiment.

Firstly, as illustrated in FIG. 1A, a laminated sheet 1 is fabricated in which an inorganic dielectric layer 3 is sandwiched between a first conductor layer 2 and a second conductor layer 4.

The second conductor layer 4 of the laminated sheet 1 is a metal foil, and a nickel foil having a thickness of approximately 0.28 μm is formed as the second conductor layer 4 in this example. A surface 4x of the second conductor layer 4 is mirror polished and has a surface roughness smaller than 0.1 μm, which is favorable flatness than a plating film having a surface roughness larger than 0.3 μm.

Further, the inorganic dielectric layer 3 is a barium titanate ($BaTiO_3$) layer which is formed on the second conductor layer 4 by a sputtering method. Moreover, the first conductor layer 2 is a copper layer having a thickness of approximately 18 μm which is formed on the inorganic dielectric layer 3 by the sputtering method.

Since the surface roughness of the second conductor layer 4 is smaller than 0.1 μm as described above, even when the thickness of the inorganic dielectric layer 3 is thinned to approximately 0.5 μm to 2 μm, there is less possibility that the second conductor layer 4 and the first conductor layer 2 are electrically short-circuited due to the surface unevenness of the second conductor layer 4. Therefore, the thickness of the inorganic dielectric layer 3 is thinned to approximately 0.9 μm in this example.

Moreover, it was revealed that, instead of employing copper as materials of both of the first conductor layer 2 and the second conductor layer 4, employing nickel as a material of the second conductor layer 4 as in this example can prevent the inorganic dielectric layer 3 sandwiched between these conductor layers 2 and 4 from being broken in the course of manufacturing the laminated sheet 1.

Further, the inorganic dielectric layer 3 functions as a capacitor dielectric layer of the wiring substrate as described later, and the material thereof is not limited to the abovementioned barium titanate.

Instead of barium titanate, any of Strontium titanate (SrTiO$_3$), lead zirconate titanate (PZT), and lead lanthanum zirconate titanate (PLZT) may be used as the material of the inorganic dielectric layer 3. Moreover, any of lead niobium zirconate titanate (PNZT), lead calcium zirconate titanate (PCZT), lead strontium zirconate titanate (PSZT), and tantalum oxide (TaO$_3$, Ta$_2$O$_5$) may be used as the material of the inorganic dielectric layer 3.

The laminated sheet 1 having a structure in which the conductor layers 2 and 4 sandwich therebetween the thin inorganic dielectric layer 3 formed by the sputtering method in this manner is also called as a thin film capacitor (TFC).

Figure 1B:
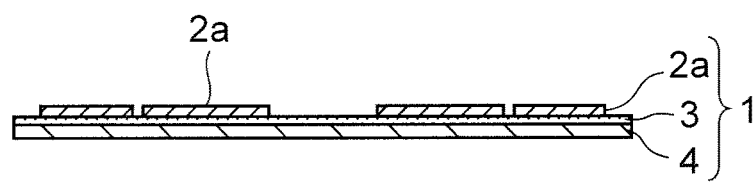

Next, as illustrated in FIG. 1B, the first conductor layer 2 is patterned to form a first conductor pattern 2a. This patterning is performed by etching the first conductor layer 2 in wet etching which uses a copper chloride aqueous solution as an etchant, while using an unillustrated resist as a mask, and the resist is removed after the etching is completed.

Figure 1C:
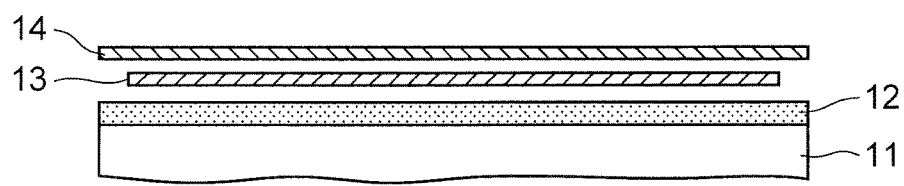

Next, as illustrated in FIG. 1C, a core base member 11 is prepare, independent of the abovementioned laminated sheet 1.

The core base member 11 is, for example, a resin base member having a thickness of 0.3 mm to 9.4 mm in which glass fiber is impregnated with an epoxy resin. On the core base member 11, an epoxy resin layer is provided as an uncured first resin layer 12 to have a thickness of 5 μm to 100 μm.

Further, a copper foil having a thickness of approximately 18 μm is disposed over the first resin layer 12 as a first metal foil 13. Moreover, a copper foil having a thickness of approximately 35 μm is disposed over the first metal foil 13 as a second metal foil 14.

Note that the second metal foil 14 has a planer size larger than that of the first metal foil 13, and extends off from the first metal foil 13 by approximately 1 cm.

Figure 1D:
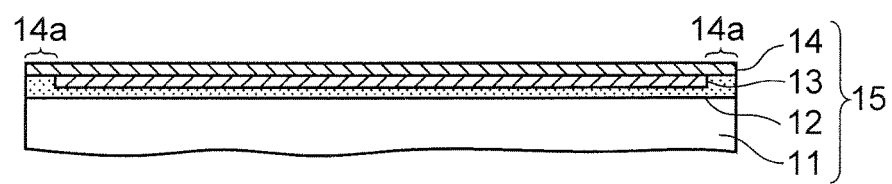

Next, as illustrated in FIG. 1D, while pressing the first metal foil 13 and the second metal foil 14 against the first resin layer 12 in a vacuum, the first resin layer 12 is heated at the temperature of approximately 180° C. and thus thermally cured.

At this time, the second metal foil 14 has a planer size larger than that of the first metal foil 13 as described above, so that edge portions 14a of the second metal foil 14 are bonded to the first resin layer 12.

On the other hand, the portion of the second metal foil 14 nearer to the center thereof than the edge portion 14a is in a state where the air is excluded between the second metal foil 14 and the first metal foil 13, and is brought into close contact with the first metal foil 13 due to atmospheric pressure.

With the steps in the foregoing, a first support substrate 15 including the first metal foil 13 and the second metal foil 14 bonded to the core base member 11 in this order is obtained.

Figure 1E:
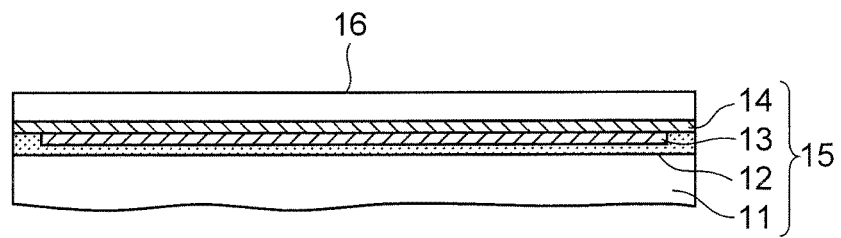

Subsequently, as illustrated in FIG. 1E, an uncured resin sheet having a thickness of approximately 5 μm to 100 μm is bonded to the second metal foil 14, and the resin sheet is used as a second resin layer 16.

In the present embodiment, a thermosetting epoxy resin with which a silica filler as an inorganic filler is kneaded is used as a material of the second resin layer 16.

Figure 1F:
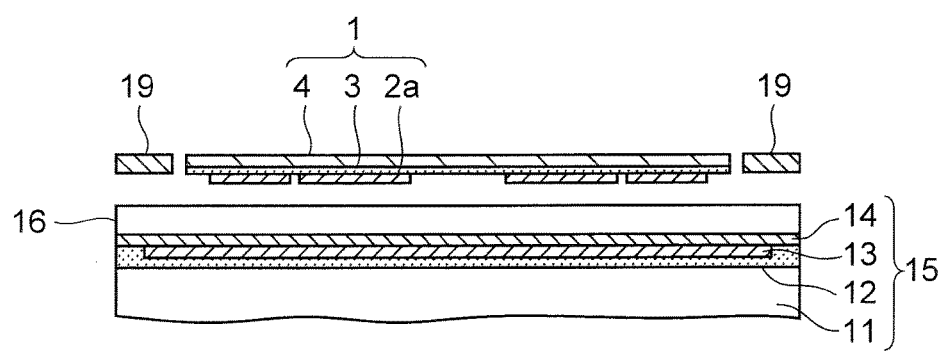

Further, as illustrated in FIG. 1F, the aforementioned laminated sheet 1 is again prepared, and the first conductor pattern 2a of the laminated sheet 1 is faced with the second resin layer 16.

Moreover, a frame 19 obtained by processing a copper foil having a thickness similar to that of the laminated sheet 1 is disposed around the laminated sheet 1.

Figure 1G:
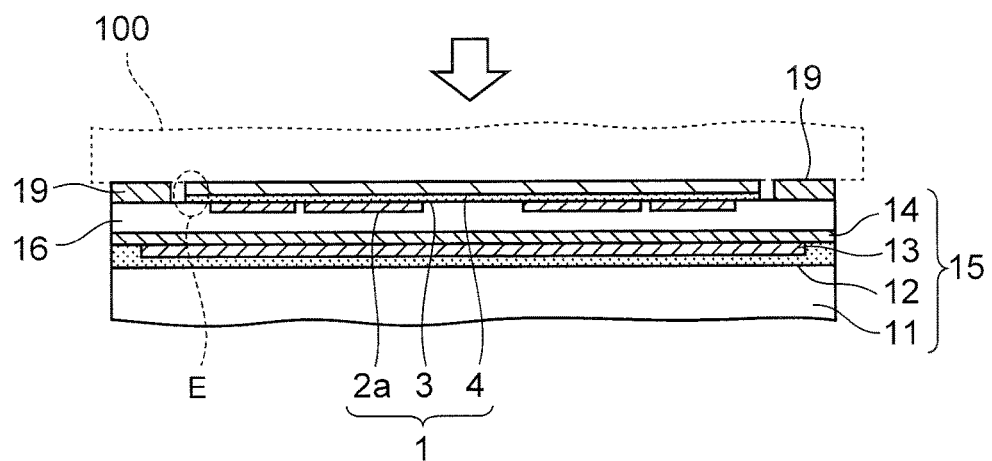

Next, as illustrated in FIG. 1G, while softening the second resin layer 16 at the temperature of approximately 100° C., the laminated sheet 1 and the frame 19 are pressed against the second resin layer 16 by a flat surface of a jig 100 in a vacuum.

With this, the first conductor pattern 2a is embedded into the softened second resin layer 16, so that the first conductor pattern 2a of the laminated sheet 1 is bonded to the second resin layer 16.

Moreover, since the frame 19 is disposed around the laminated sheet 1, force applied from the jig 100 is suppressed from concentrating on the corner portions E of the laminated sheet 1, thereby making it possible to prevent the corner portions E from protruding through the second resin layer 16.

Thereafter, the second resin layer 16 is heated at the temperature of approximately 170° C. to 180° C. for approximately 40 minutes to 80 minutes, thereby thermally curing the second resin layer 16.

Here, since the first support substrate 15 is thicker and harder than the laminated sheet 1, flatness of the laminated sheet 1 becomes favorable by bonding the laminated sheet 1 to the first support substrate 15 in this manner.

Figure 1H:
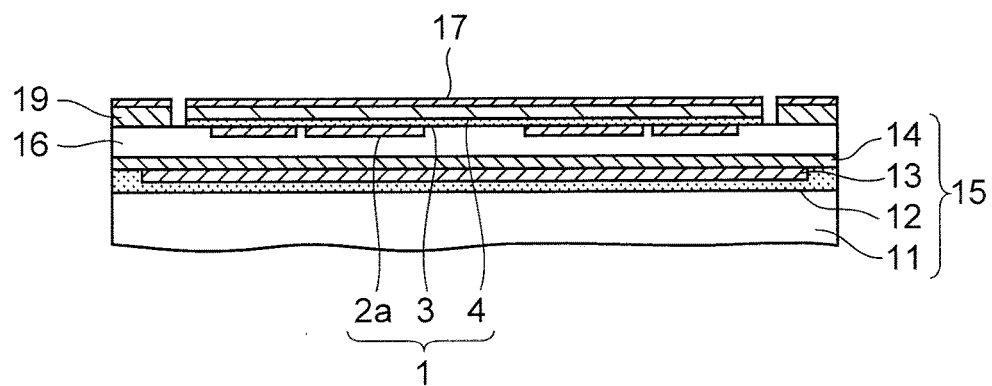

Subsequently, as illustrated in FIG. 1H, a copper layer is formed by an electrolytic plating method so as to have a thickness of from approximately 5 μm to 35 μm on the second conductor layer 4, and the copper layer is used as a third conductor layer 17.

Figure 1I:
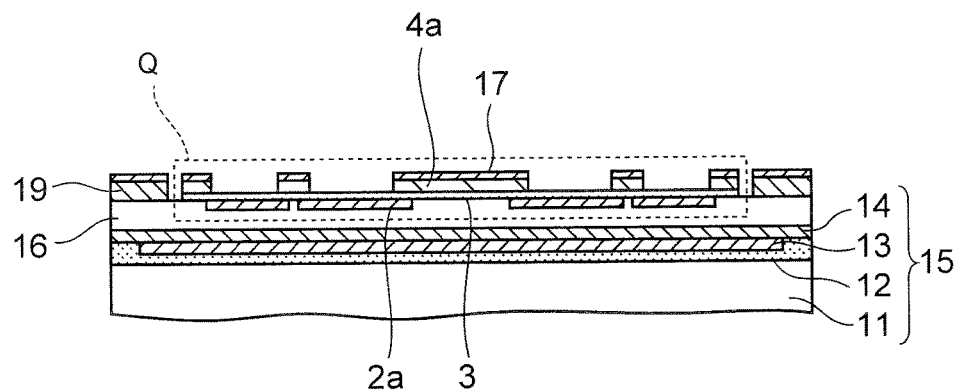

In addition, as illustrated in FIG. 1I, the second conductor layer 4 and the third conductor layer 17 are respectively patterned, and the patterned second conductor layer 4 is used as a second conductor pattern 4a.

This patterning is performed by wet etching the conductor layers 4 and 17 while using an unillustrated dry film resist as a mask, and the dry film resist is removed after the wet etching is completed.

When the second conductor layer 4 is a nickel foil and the third conductor layer 17 is a copper layer as described above, an etchant which can be used in this wet etching includes a copper chloride aqueous solution. The inorganic dielectric layer 3 does not dissolve in this etchant, so that the inorganic dielectric layer 3 is not patterned even when this step is performed.

With the steps in the foregoing, the basic structure of a capacitor Q which includes the respective conductor patterns 2a and 4a, and the inorganic dielectric layer 3 sandwiched between these conductor patterns 2a and 4a is obtained.

In the capacitor Q, the respective conductor patterns 2a and 4a function as electrodes, and the inorganic dielectric layer 3 functions as a capacitor dielectric layer. Since the inorganic dielectric layer 3 is formed so as to have a thin thickness of approximately 0.9 µm by the sputtering method, the electrostatic capacitance of the capacitor Q can be increased.

In addition, since the flatness of the laminated sheet 1 becomes favorable due to the first support substrate 15, it is easy to pattern the second conductor layer 4 in this step.

Figure 3A:
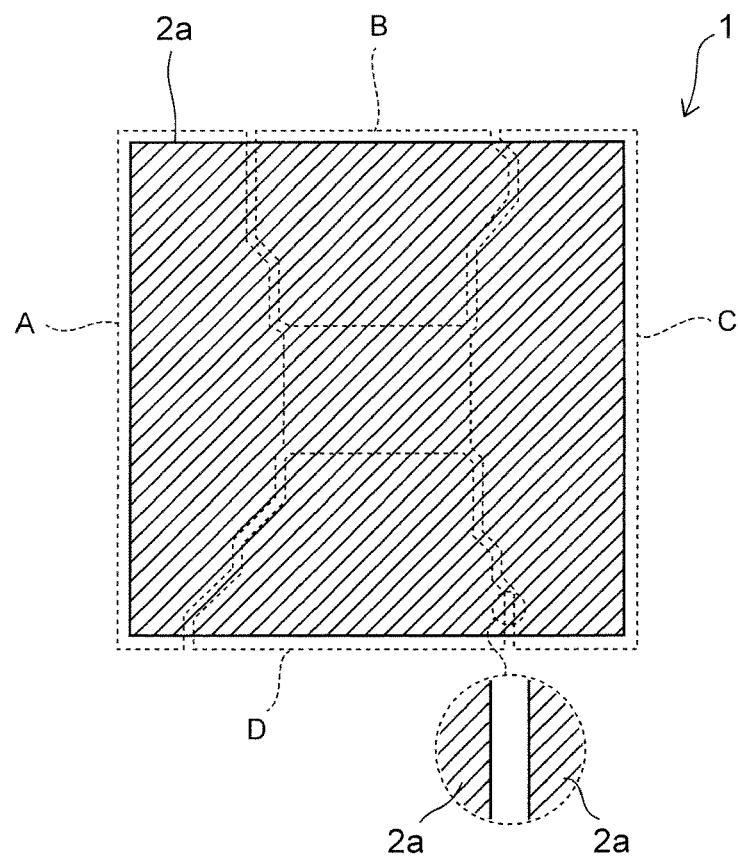
FIGS. 3A and 3B are overall plan views of a laminated sheet in the course of manufacturing the wiring substrate according to the first embodiment.

FIG. 3A is an overall plan view of the laminated sheet 1 after this step is completed seen from the first conductor pattern 2a.

Note that, in FIG. 3A, details of the first conductor pattern 2a are omitted.

As illustrated in FIG. 3A, the first conductor pattern 2a is divided into a plurality of regions A to D in this example. Note that no first conductor pattern 2a is present in a boundary portion between adjacent two regions among these regions A to D, and the respective first conductor patterns 2a in the regions A to D are electrically separated from one another.

As is described later, the first conductor pattern 2a is electrically connected to a power supply terminal of a semiconductor element and a motherboard. Therefore, by diving the first conductor pattern 2a into the plurality of regions A to D in this manner, power supply voltages of different voltages can be applied to each region A to D, making it possible to use the semiconductor element and the motherboard which are driven by multiple kind of power supply voltages.

Figure 3B:
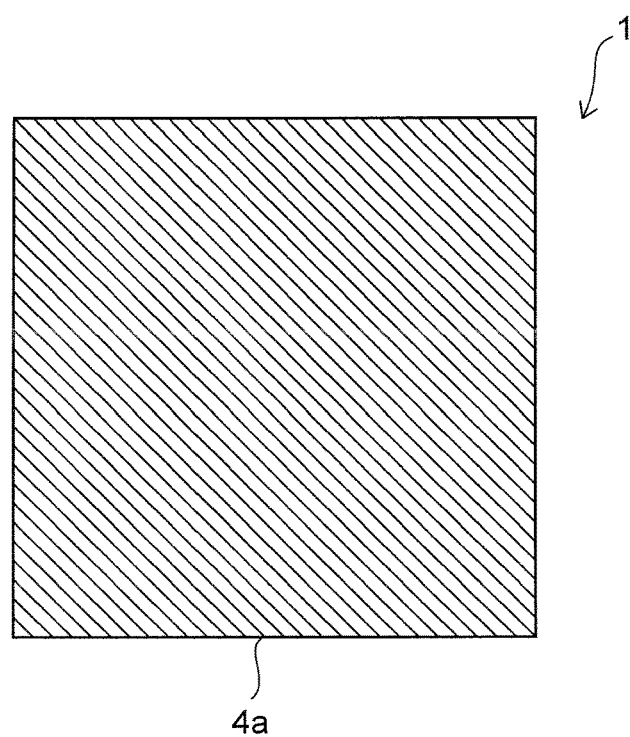

Meanwhile, FIG. 3B is an overall plan view of the laminated sheet 1 after this step is completed seen from the second conductor pattern 4a.

Note that, in FIG. 3B, details of the second conductor pattern 4a are omitted.

As illustrated in FIG. 3B, different from the aforementioned first conductor pattern 2a, the second conductor pattern 4a is not divided into a plurality of regions.

As described later, the second conductor pattern 4a is electrically connected to a ground terminal of the semiconductor element and the motherboard. Therefore, the second conductor pattern 4a does not need to be divided for each power supply as in the first conductor pattern 2a, and the second conductor pattern 4a can be common to all the power supplies without being divided as is in this example.

In particular, the material of the second conductor pattern 4a is nickel, whose Young's modulus is higher than that of copper that is the material of the first conductor pattern 2a. Therefore, by not dividing the second conductor pattern 4a in this manner, the laminated sheet 1 becomes difficult to be deformed by a stress, which results in the favorable flatness of the substrate after being completely manufactured.

Figure 1J:
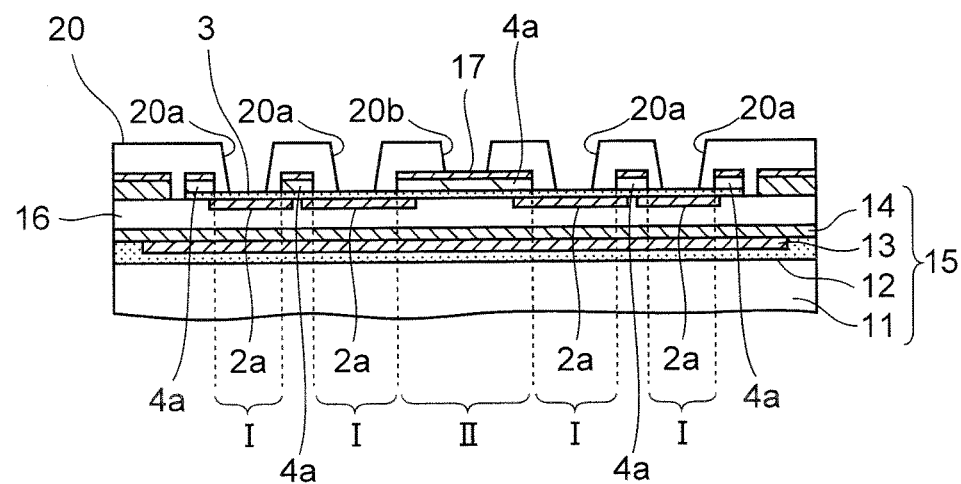

Next, as illustrated in FIG. 1J, an epoxy resin sheet is bonded to the second conductor pattern 4a, and the resin sheet is thermally cured to form a first insulating layer 20.

The third conductor layer 17, whose material is copper, functions not only to reduce the resistance of the second conductor pattern 4a, but also to increase the adhesion between the first insulating layer 20 and the second conductor pattern 4a.

Note that, when the increase in adhesion or the reduction in resistance is unnecessary, the third conductor layer 17 may be omitted.

Thereafter, first via holes 20a and a second via hole 20b are formed by laser beam in the first insulating layer 20.

Among these via holes 20a and 20b, the first via hole 20a is formed in a first region I which locates on the first conductor pattern 2a and where no second conductor pattern 4a is present, and the inorganic dielectric layer 3 exposes in a bottom of the first via hole 20a.

Meanwhile, the second via hole 20b is formed in a second region II where the second conductor pattern 4a is present, and the third conductor layer 17 exposes in a bottom of the second via hole 20b.

Further, in this step, by adjusting the power of the laser, the inorganic dielectric layer 3 and the second conductor pattern 4a are prevented from being opened by the laser.

Figure 1K:
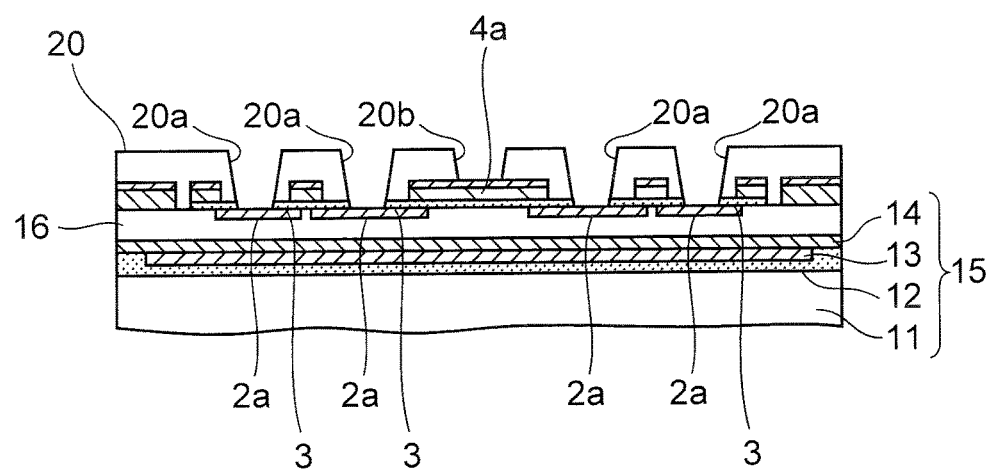

Next, as illustrated in FIG. 1K, the inorganic dielectric layer 3 under the first via hole 20a is removed by wet etching using a hydrochloric acid as an etchant. Thus, the first conductor pattern 2a is exposed in the bottom of the first via hole 20a.

Note that in the step of FIG. 1J, it can be considered that the inorganic dielectric layer 3 under the first via hole 20a is also removed by the laser simultaneously when the first via hole 20a is formed by the laser. However, compared with the case where the first insulating layer 20 formed of the resin is processed by the laser, the power of the laser needs to be increased for processing the inorganic dielectric layer 3 formed of the inorganic material by the laser, so that there is a possibility that the first via hole 20a is deformed due to the high-power laser.

Therefore, in order to prevent the first via hole 20a from being deformed, the inorganic dielectric layer 3 is preferably opened by wet etching as in the present embodiment.

Figure 4:
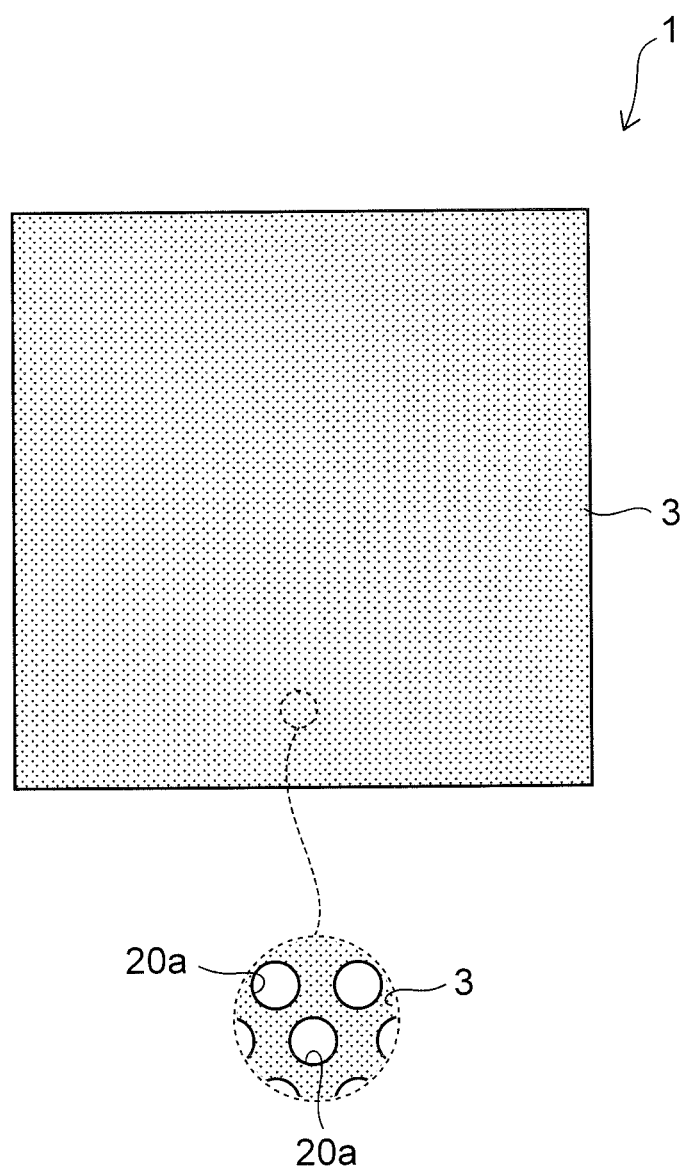
FIG. 4 is an overall plan view of an inorganic dielectric layer in the course of manufacturing the wiring substrate according to the first embodiment.

FIG. 4 is an overall plan view of the inorganic dielectric layer 3 of the laminated sheet 1 after this step is completed.

As illustrated in FIG. 4, the inorganic dielectric layer 3 is formed on the entire surface of the laminated sheet 1 except the first via holes 20a.

Figure 1L:
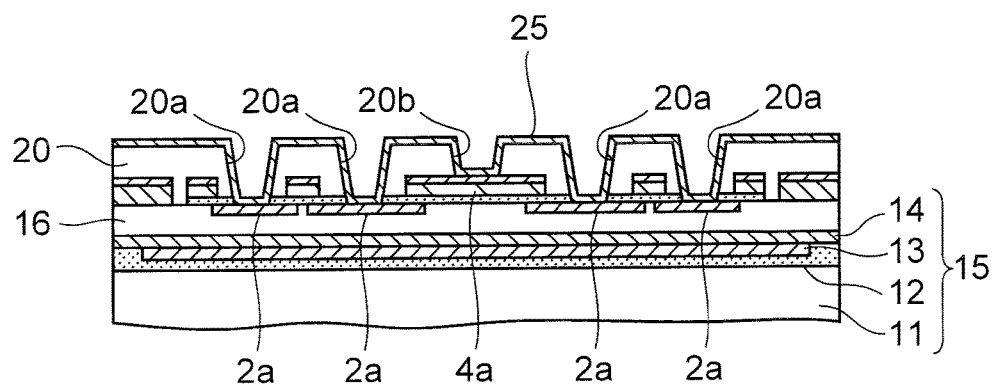

Subsequently, as illustrated in FIG. 1L, an electroless copper plating film 25 is formed so as to have a thickness of approximately 0.1 µm to 3 µm on the first insulating layer 20 and inner surfaces of the respective via holes 20a and 20b.

Next, steps for obtaining a cross-sectional structure illustrated in FIG. 1M will be described.

Firstly, an unillustrated dry resist film is bonded to the electroless copper plating film 25 (FIG. 1L). Then, an electrolytic copper plating film is grown on a portion of the electroless copper plating film 25 which is not covered with the dry film resist, and thus the respective via holes 20a and 20b are filled with the electrolytic copper plating film.

Thereafter, the dry film resist is peeled off, and the electroless copper plating film 25 is wet-etched. Thus, first and second via conductors 26a and 26b are formed in the first and second via holes 20a and 20b respectively, and a first wiring layer 26x is formed on the first insulating layer 20.

Such a method of forming the wiring and the via conductors is called a semi-additive method.

Here, the second via conductor 26b is electrically connected to the second conductor pattern 4a, whereas the first via conductor 26a skips the second conductor pattern 4a, and is connected to the first conductor pattern 2a under the second conductor pattern 4a. The via conductor which skips one layer and is connected to the next layer in this manner is called a skip via in some cases.

By employing the skip via structure, the both electrodes of the capacitor Q can easily be drawn out to the surface of the first insulating layer 20.

In particular, it is difficult to form a through-hole in the laminated sheet 1 having a thin thickness while controlling the depth by drilling, and is extremely difficult to draw out both electrodes of the capacitor Q at the same surface through the through-holes, so that it is highly beneficial to form the skip via structure by laser beam machining in this manner.

Note that although the second via conductor 26b is electrically connected to the second conductor pattern 4a via the third conductor layer 17, the second via conductor 26b is directly connected to the second conductor pattern 4a in the case where the third conductor layer 17 is omitted.

Figure 1M:
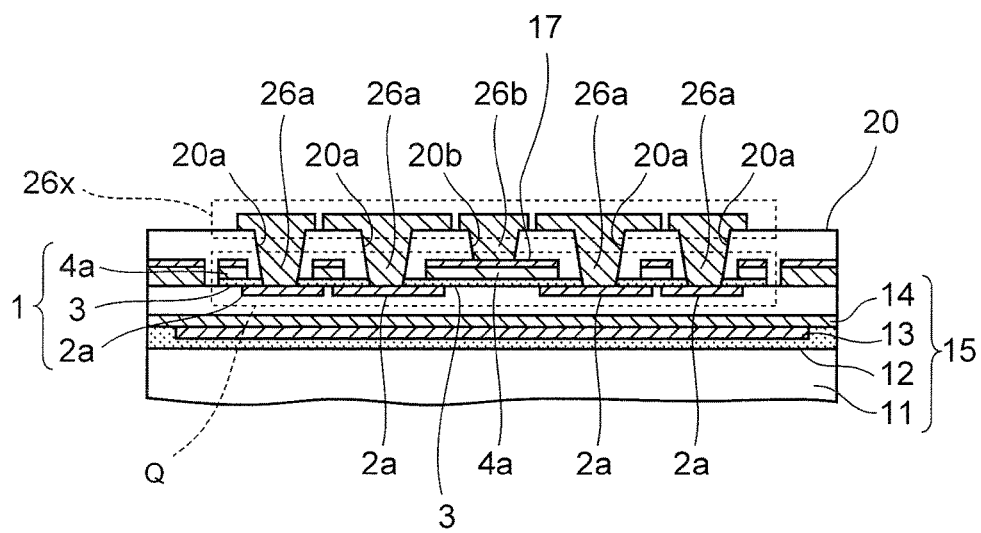
Figure 1N:
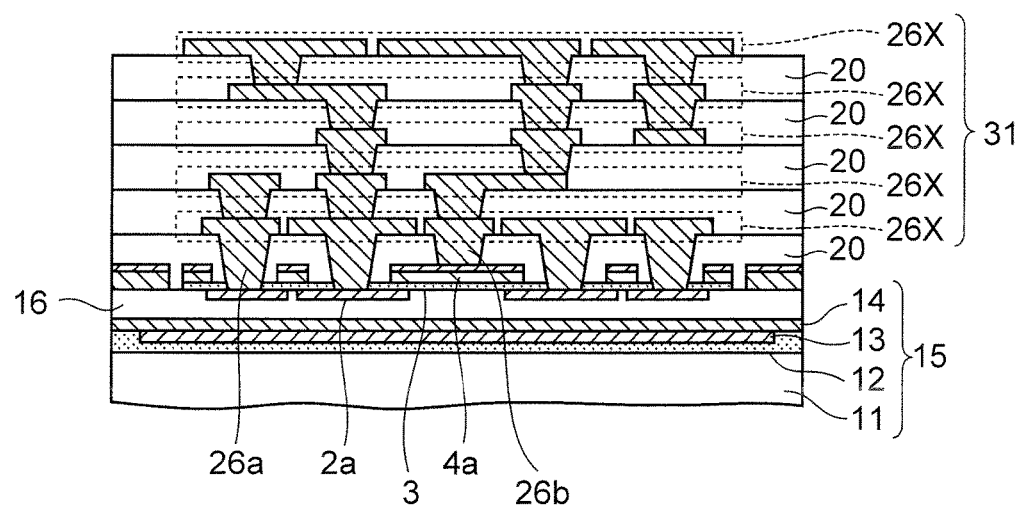

Thereafter, as illustrated in FIG. 1N, by the build-up method in which a plurality of layers of the first insulating layer 20 and the first wiring layer 26x are formed, a first multilayer wiring layer 31 is formed on the respective via conductors 26a and 26b.

Although the number of wiring layers in the first multilayer wiring layer 31 is not particularly limited, the number of wiring layers in this example is five layers.

Figure 1O:
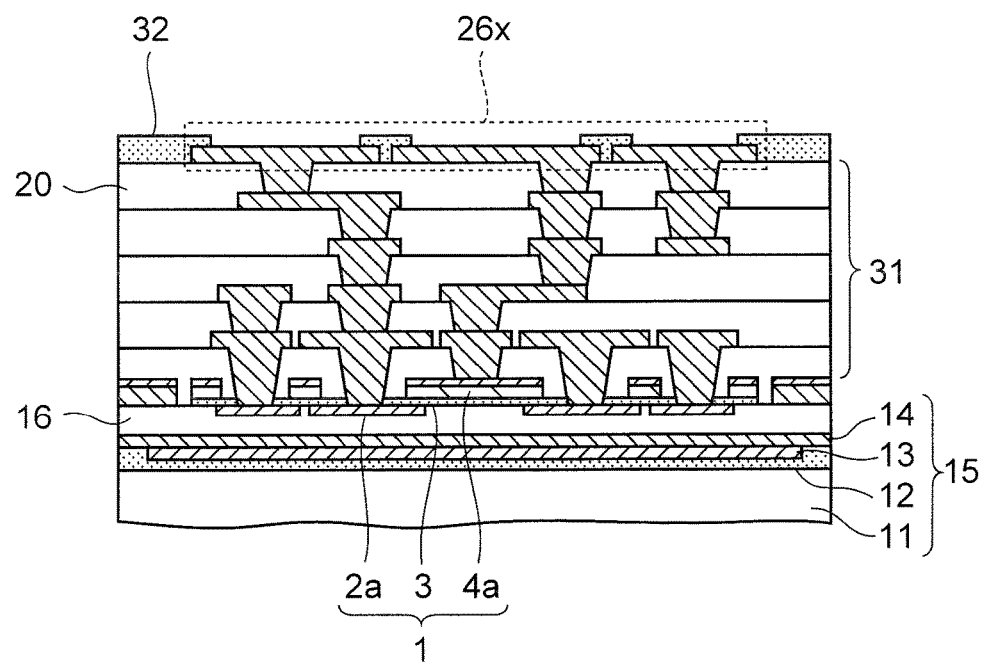

Next, as illustrated in FIG. 1O, a first solder resist layer 32 is formed on a topmost layer of the first multilayer wiring layer 31 by a printing method. Note that a part of the topmost first wiring layer 26x is not covered with the first solder resist layer 32 but is exposed.

Figure 1P:
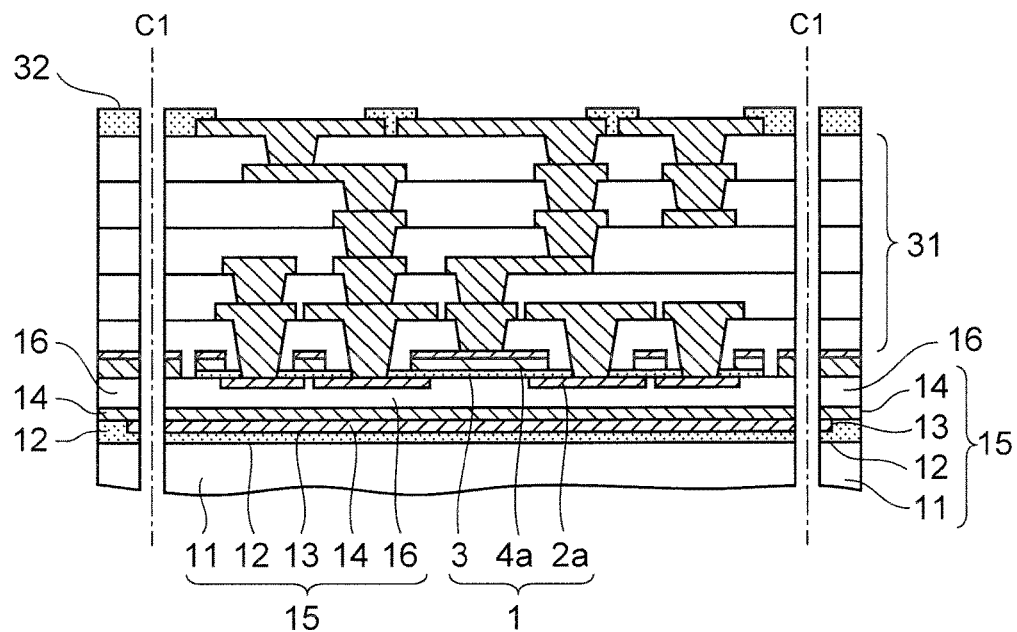

Thereafter, as illustrated in FIG. 1P, edge portions of the first support substrate 15 on which the first multilayer wiring layer 31 is formed in the manner described above are cut out along first cut-out lines C1.

The first cut-out line C1 is set so as to pass through an inner side than the portion where the second metal foil 14 is bonded to the first resin layer 12 in the edge portion of the first support substrate 15. With this, the second metal foil 14 after the cutting is in a state of contacting with the first metal foil 13 by atmospheric pressure, and can be easily peeled off from the first metal foil 13 by an external force.

Figure 1Q:
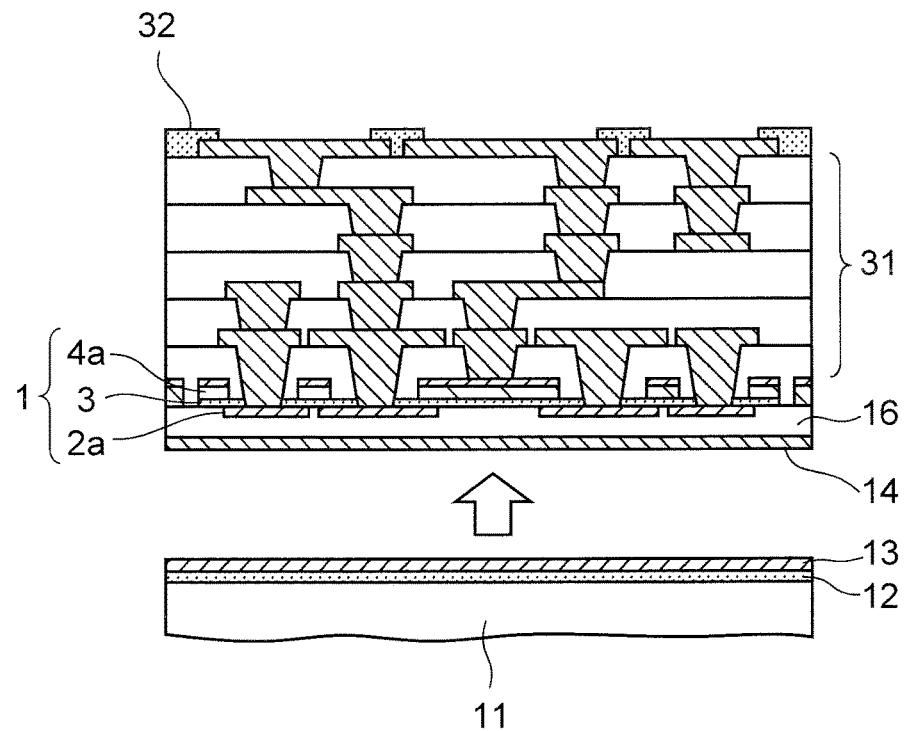

Then, as illustrated in FIG. 1Q, the second metal foil 14 is peeled off from the first metal foil 13. Thus, the laminated sheet 1 and the first multilayer wiring layer 31 are peeled off from the first support substrate 15.

Note that the second metal foil 14 constituting the first support substrate 15 is moved to the laminated sheet 1 by the adhesive strength of the second resin layer 16.

Figure 1R:
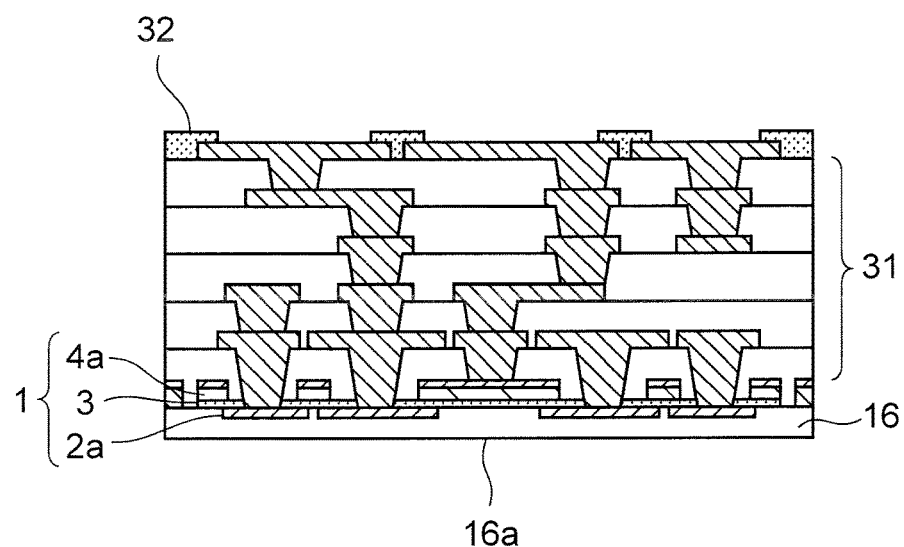

Further, as illustrated in FIG. 1R, the second metal foil 14 moved to the laminated sheet 1 is removed by wet etching while using a copper chloride aqueous solution as an etchant for example, and a surface 16a of the second resin layer 16 is caused to expose.

Figure 1S:
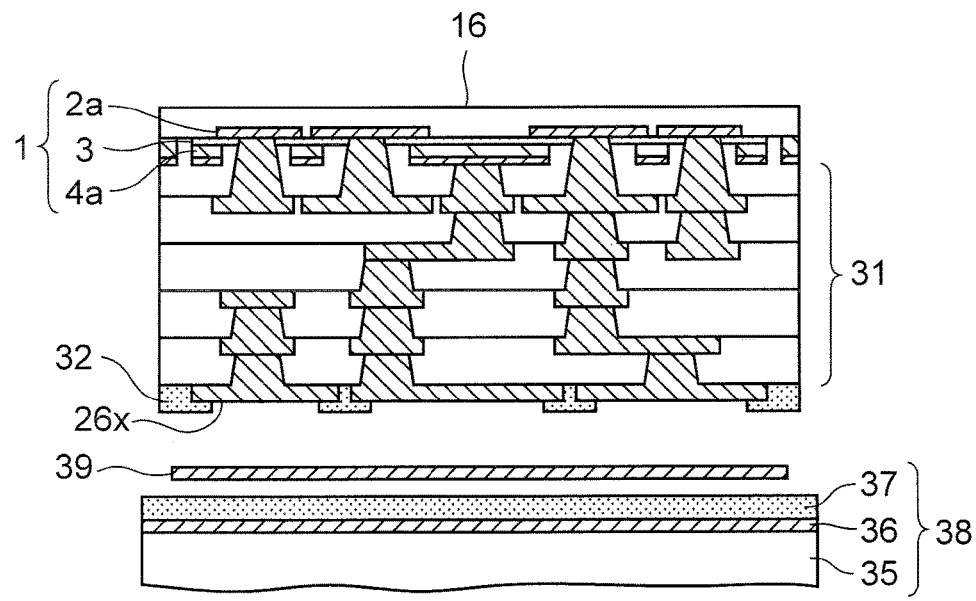

Next, steps illustrated in FIG. 1S will be described.

Firstly, a second support substrate 38 in which a copper foil 36 and a third resin layer 37 are formed in this order on a core base member 35 is prepared.

The core base member 35 is a resin base member having a thickness of 0.3 mm to 9.4 mm in which glass fiber is impregnated with an epoxy resin, for example, and is thicker than the aforementioned first multilayer wiring layer 31. Moreover, the third resin layer 37 is an uncured epoxy resin layer having a thickness of 5 μm to 100 μm, for example.

Further, a copper foil having a thickness of approximately 5 μm to 35 μm and serving as a metal foil 39 is disposed over the second support substrate 38, and the first multilayer wiring layer 31 is disposed over the metal foil 39.

Note that the metal foil 39 has a planer size smaller than that of the first multilayer wiring layer 31 and, in this example, end portions of the metal foil 39 are positioned inward of outer circumference side surfaces of the first multilayer wiring layer 31 by approximately 1 cm.

Figure 1T:
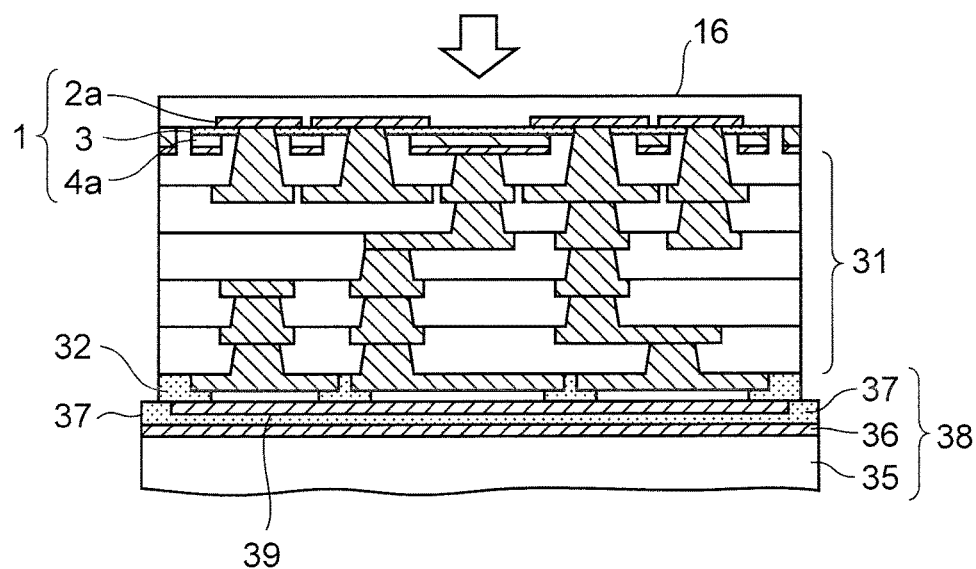

Next, as illustrated in FIG. 1T, while the third resin layer 37 is softened at the temperature of approximately 100° C. in a vacuum, the first multilayer wiring layer 31 and the metal foil 39 are pressed against the third resin layer 37 to bond the metal foil 39 to the third resin layer 37.

Here, since the metal foil 39 has a planer size smaller than that of the first multilayer wiring layer 31 in this example, the first solder resist layer 32 is bonded to the third resin layer 37 in edge portions of the second support substrate 38.

On the other hand, the air between the first multilayer wiring layer 31 and the metal foil 39 is excluded in a portion of the second support substrate 38 nearer to the center thereof, so that the first multilayer wiring layer 31 is brought into close contact with the metal foil 39 due to atmospheric pressure.

In addition, the flatness of the first multilayer wiring layer 31 becomes favorable by bonding the first multilayer wiring layer 31 to the second support substrate 38 in this manner, since the second support substrate 38 is thicker and harder than the first multilayer wiring layer 31.

Therefore, it becomes easy to form various films on the first multilayer wiring layer 31 and to pattern these films in subsequent steps.

Figure 1U:
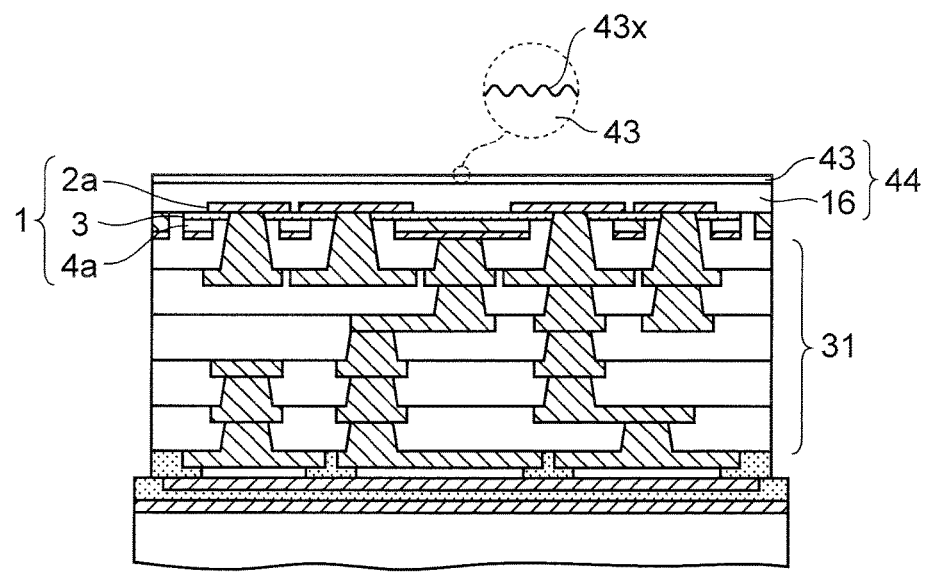

Subsequently, as illustrated in FIG. 1U, a resin sheet of a thermosetting epoxy resin is bonded onto the second resin layer 16 as a covering layer 43, and the second resin layer 16 and the covering layer 43 constitute a second insulating layer 44.

Note that the covering layer 43 includes not only the epoxy resin but also a silica filler as an inorganic filler. Moreover, the thickness of the covering layer 43 is 10 μm, for example.

Then, the covering layer 43 is heated at the temperature of approximately 170° C. for approximately one hour to partially cure the covering layer 43. The process in which the resin is not entirely cured but is partially cured is also called preliminary curing.

Thereafter, a surface layer portion of the covering layer 43 is etched with a strong alkaline solution to cause a silica filler contained in the surface layer portion to elute into the strong alkaline solution. Thus, unevenness associated with the silica filler is formed in a surface 43x of the covering layer 43.

Such a process is called desmear process.

It can also be considered that, without forming the covering layer 43, the desmear process is performed on the second resin layer 16 under the covering layer 43. However, since the second resin layer 16 is completely thermally cured in the step of FIG. 1G already, it is difficult to dissolve the second resin layer 16 with the strong alkaline solution, and hence it is difficult to form unevenness on the surface of the second resin layer 16. Therefore, as in the present embodiment, it is preferable to form the covering layer 43 on the second resin layer 16, and perform the desmear process on the covering layer 43 which is not completely thermally cured.

Then, after the desmear process is performed in this manner, the covering layer 43 is heated at the temperature of approximately 180° C. for approximately one hour to completely thermally cure the covering layer 43.

Figure 1V:
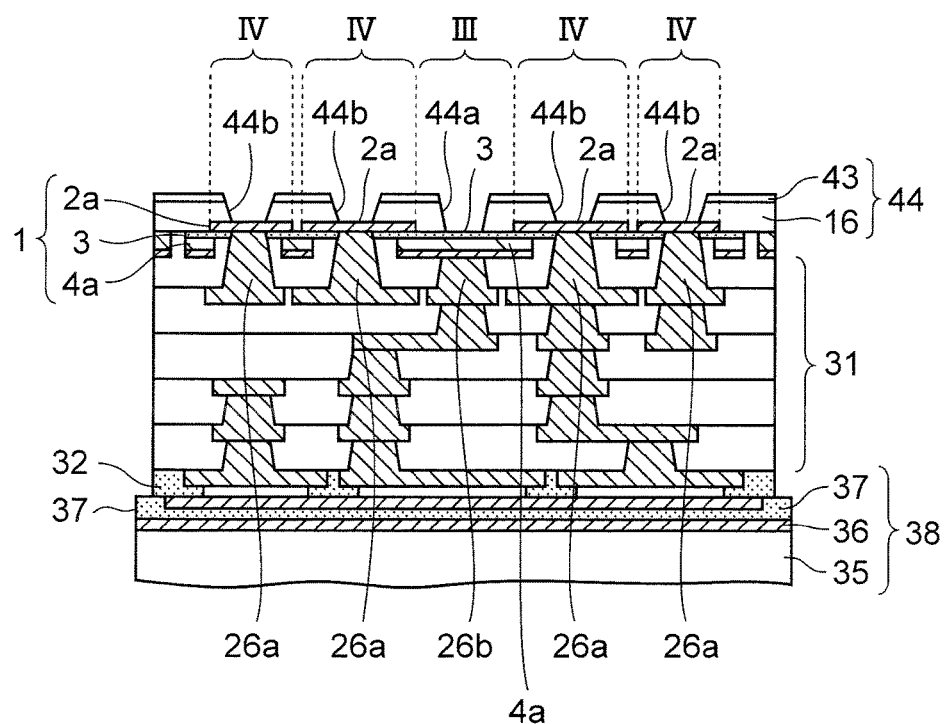

Subsequently, as illustrated in FIG. 1V, a third via hole 44a and fourth via holes 44b are formed in the second insulating layer 44 by laser beam.

Among these via holes 44a and 44b, the third via hole 44a is formed in a third region III which locates on the second conductor pattern 4a and where no first conductor pattern 2a is present, and the inorganic dielectric layer 3 exposes in a bottom of the third via hole 44a.

On the other hand, the fourth via hole 44b is formed in a fourth region IV where the first conductor pattern 2a is present, and the first conductor pattern 2a exposes in a bottom of the fourth via hole 44b.

Note that in this step, the inorganic dielectric layer 3 and the first conductor pattern 2a are prevented from being opened by adjusting the power of the laser.

Figure 1W:
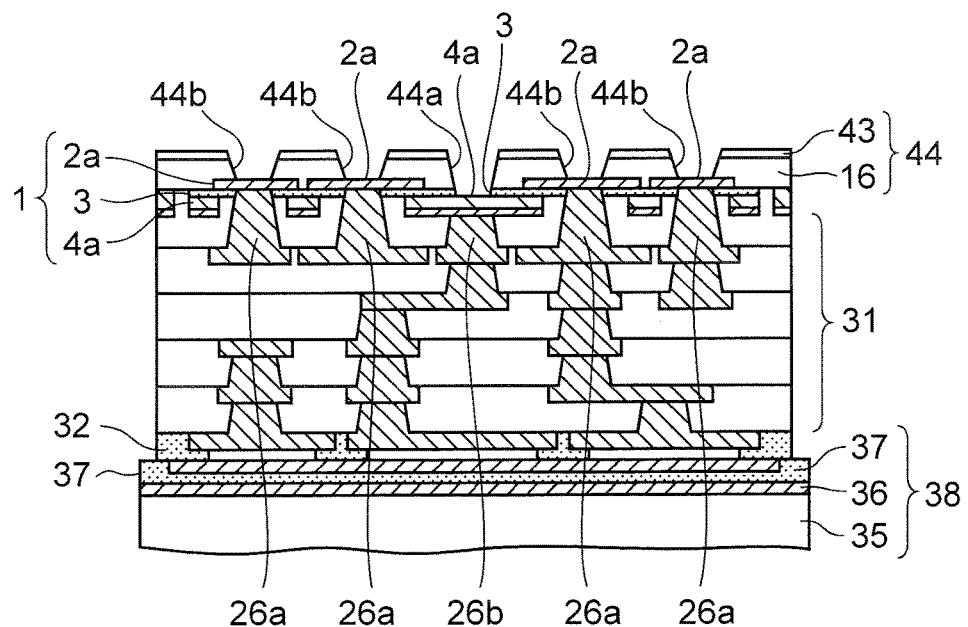

Next, as illustrated in FIG. 1W, the inorganic dielectric layer 3 under the third via hole 44a is removed by wet etching while using a hydrochloric acid as an etchant, and the second conductor pattern 4a is caused to expose in the bottom of the third via hole 44a.

As described in the step of FIG. 1K, by opening the inorganic dielectric layer 3 by wet etching in this manner, the shape of the third via hole 44a is prevented from being deformed which would occur when the inorganic dielectric layer 3 is opened by laser.

Figure 1X:
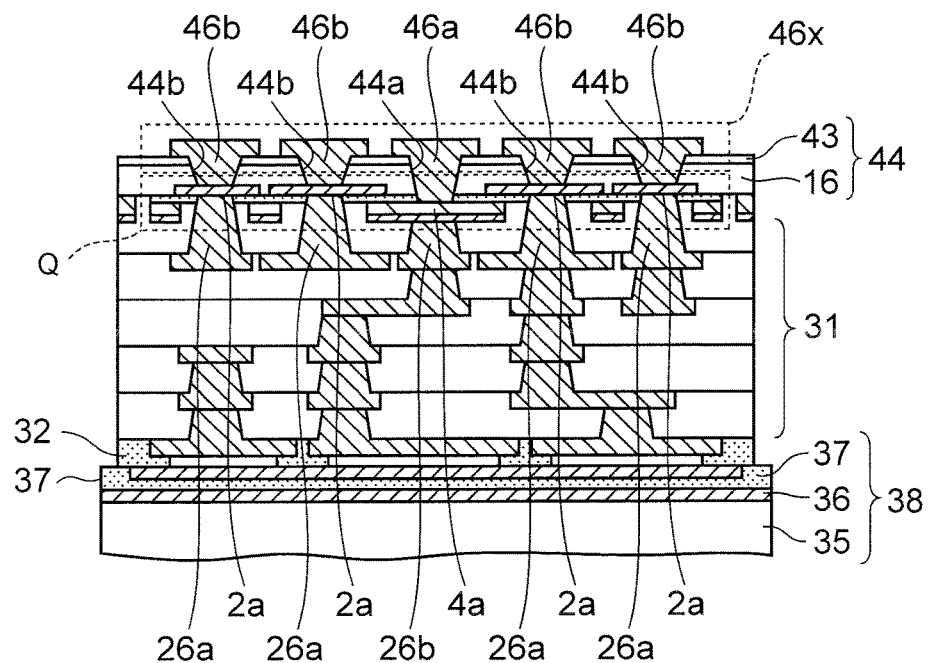

Further, as illustrated in FIG. 1X, by using the semi-additive method, third and fourth via conductors 46a and 46b are formed in the third and fourth via holes 44a and 44b respectively, and a second wiring layer 46x is formed on the second insulating layer 44.

Similar to the steps of FIGS. 1L and 1M, the respective via conductors 46a and 46b and the second wiring layer 46x are formed of an electroless copper plating film and an electrolytic copper plating film formed thereon.

Here, while the fourth via conductor 46b is connected to the first conductor pattern 2a, the third via conductor 46a has the skip via structure, in which the third via conductor 46a skips the first conductor pattern 2a and is connected to the second conductor pattern 4a under the first conductor pattern 2a.

This skip via structure can easily draw out both electrodes of the capacitor Q to the surface of the second insulating layer 44 with the same reason as the step of FIG. 1M.

Moreover, since the respective via holes 20a, 20b, 44a, and 44b are formed by laser whose power is adjusted so as not to open the conductor patterns 2a and 4a in order to form the skip via structure, the conductor patterns 2a and 4a are not opened by laser in the present embodiment. Therefore, the first conductor pattern 2a is interposed between the first via conductor 26a and the fourth via conductor 46b, and the second conductor pattern 4a is interposed between the second via conductor 26b and the third via conductor 46a.

In addition, since the unevenness is formed in advance in the surface 43x (FIG. 1U) of the covering layer 43 by the desmear process in the step of FIG. 1U, the adhesion between the second wiring layer 46x and the covering layer 43 can be increased.

Figure 1Y:
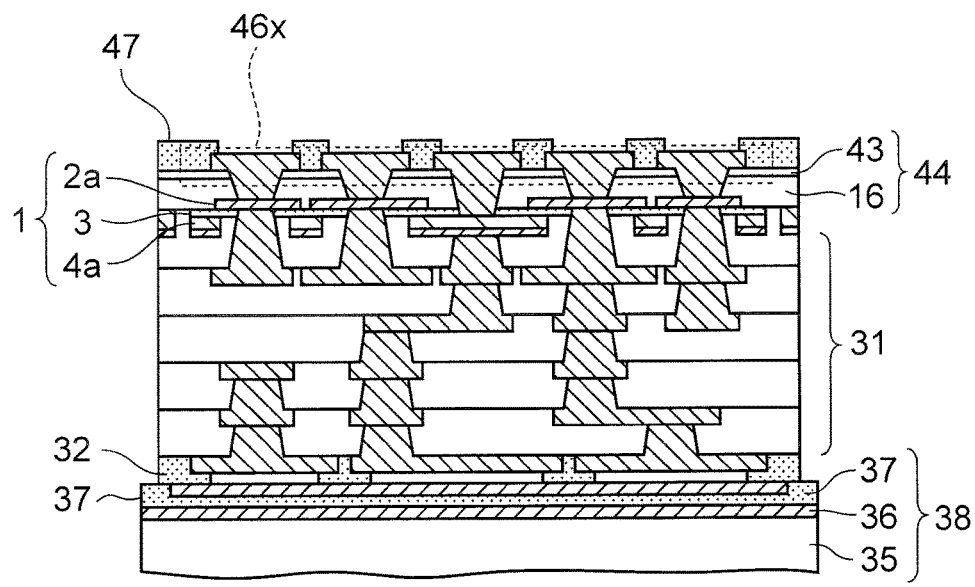

Subsequently, as illustrated in FIG. 1Y, a second solder resist layer 47 is formed on the second insulating layer 44 by the printing method. Note that a part of the second wiring layer 46x is not covered with the second solder resist layer 47 but is exposed.

Figure 1Z:
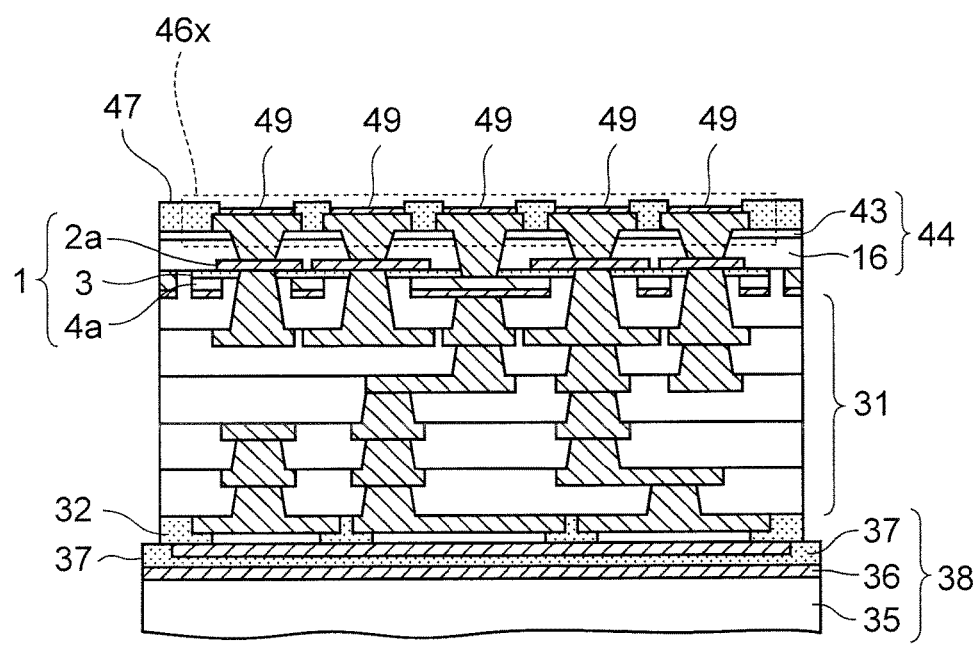

Then, as illustrated in FIG. 1Z, a gold layer 49 is formed so as to have a thickness of approximately 0.001 μm to 0.5 μm on a surface of the part of the second wiring layer 46x which is not covered with the second solder resist layer 47 by the plating method.

Figure 2A:
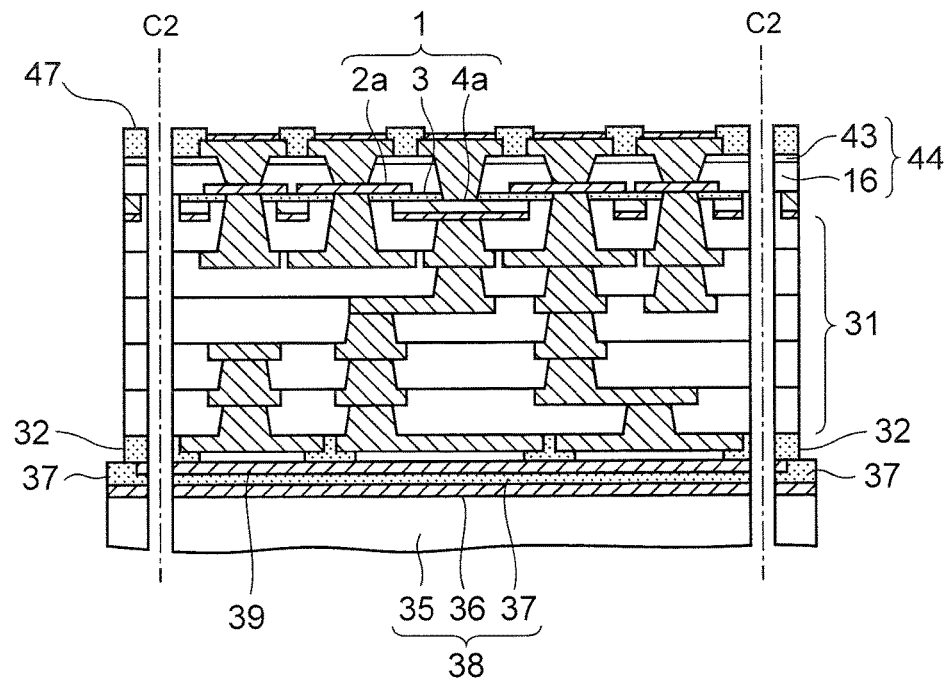

Next, as illustrated in FIG. 2A, portions from the second support substrate 38 to the topmost second solder resist layer 47 are cut out along second cut-out lines C2.

The second cut-out line C2 is set so as to pass through an inner side than a portion where the first solder resist layer 32 is bonded to the third resin layer 37 in an edge portion of the second support substrate 38. Therefore, the first multilayer wiring layer 31 after the cutting is only in contact with the metal foil 39 by atmospheric pressure, and can be easily peeled off from the metal foil 39 by an external force.

Note that the shape and the size after the cutting are not specially limited. In this example, the portions from the second support substrate 38 to the second solder resist layer 47 are cut out into the square shape whose one length is 35 mm in planer view.

Figure 2B:
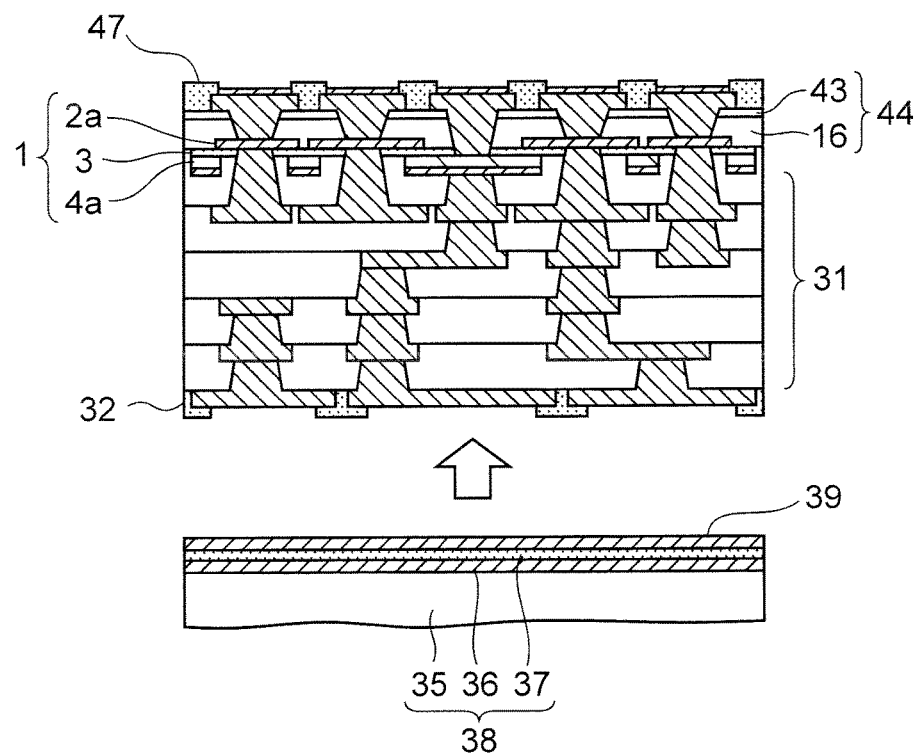

Further, as illustrated in FIG. 2B, the first multilayer wiring layer 31 and the laminated sheet 1 thereon are peeled off from the metal foil 39.

Figure 2C:
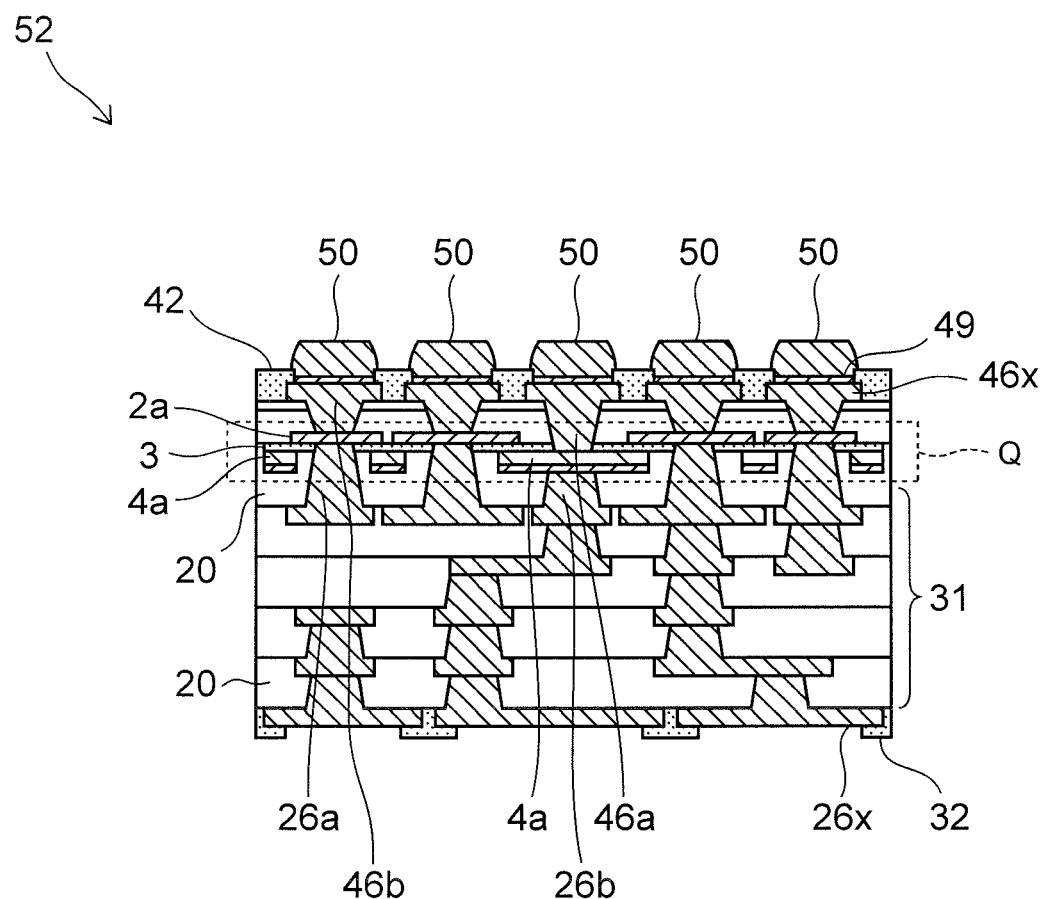

Thereafter, as illustrated in FIG. 2C, by employing the printing method, a soldering paste as a presolder 50 is applied onto the second wiring layer 46x whose wettability is improved with the gold layer 49. Further, after the presolder 50 is subjected to reflow to be made into a spherical shape, an upper portion of the presolder 50 is made flat by coining. Note that in order to perform the coining, the presolder 50 may be crushed flat by an unillustrated jig, for example.

With the foregoing steps, the basic structure of a wiring substrate 52 according to the present embodiment is completed.

This wiring substrate 52 is a coreless multilayer wiring substrate including no core substrate, and can be made thinner by the thickness of the core substrate.

Moreover, the electrostatic capacitance of the capacitor Q embedded in the wiring substrate 52 can be increased by forming the inorganic dielectric layer 3 to be thin by the sputtering method.

According to the aforementioned manufacturing method of the wiring substrate 52, since the laminated sheet 1 is bonded to the first support substrate 15 as in FIG. 1H, flatness of the thin laminated sheet 1 becomes favorable. Therefore, the second conductor pattern 4a can be easily formed even in the laminated sheet 1 provided with the thin inorganic dielectric layer 3 having a thickness of 2 μm or less, by patterning the second conductor layer 4 in the step of FIG. 1I.

In addition, by using the first support substrate 15 in this manner, the first multilayer wiring layer 31 can be formed on the laminated sheet 1 by the build-up method, without using the dedicated process or facility to the thin laminated sheet 1.

In addition, as illustrated in FIG. 1M, the first via conductor 26a having a skip via structure is connected to the first conductor pattern 2a. Therefore, the first conductor pattern 2a can be electrically drawn out to the same side as the first via conductor 26a.

The method of using the wiring substrate 52 is not particularly limited.

Figure 5:
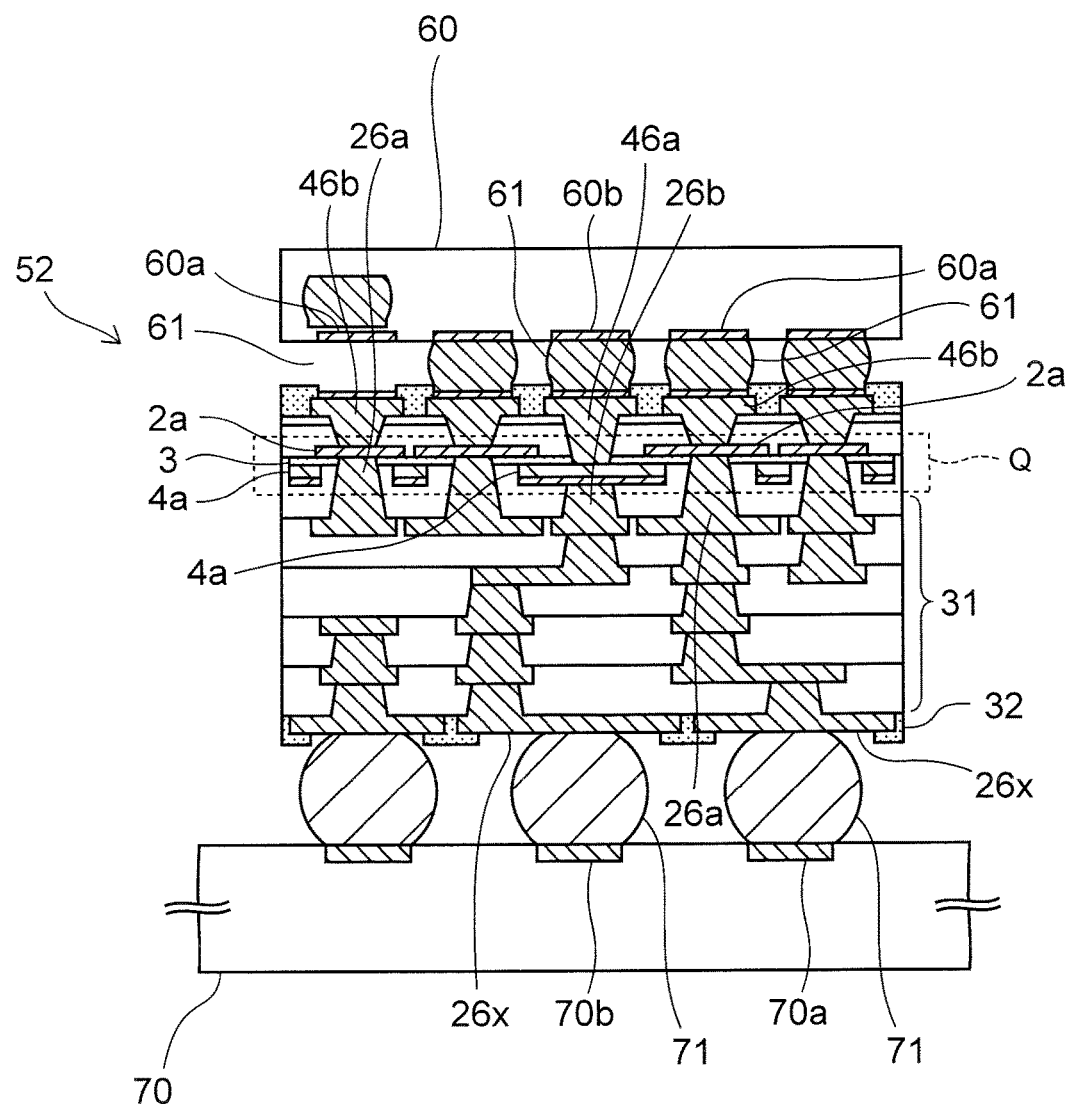
FIG. 5 is a cross-sectional view illustrating an example of method of using the wiring substrate according to the first embodiment.

FIG. 5 is a cross-sectional view illustrating an example of method of using the wiring substrate 52.

In this example, a semiconductor element 60 is provided at the first conductor pattern 2a side of the capacitor Q, and a circuit substrate 70 is provided at the second conductor pattern 4a side of the capacitor Q.

The semiconductor element 60 includes a first power supply terminal 60a and a first ground terminal 60b, and first soldering bumps 61 are jointed onto these terminals. Further, in the state where the first soldering bumps 61 are mounted on the presolder 50 (see FIG. 2C), the first soldering bumps 61 are heated to be ref lowed.

With this, the fourth via conductor 46b is electrically connected to the first power supply terminal 60a, and the third via conductor 46a is electrically connected to the first ground terminal 60b.

On the other hand, the circuit substrate 70 includes a second power supply terminal 70a and a second ground terminal 70b. Moreover, second soldering bumps 71 are disposed between the lowermost wiring layer 26x of the wiring substrate 52 and the respective terminals 70a and 70b, and the second soldering bumps 71 are heated to be reflowed.

As a result, the second power supply terminal 70a is electrically connected to the first via conductor 26a, and the second ground terminal 70b is electrically connected to the second via conductor 26b.

With this, one of the electrodes of the capacitor Q is electrically connected to each of the power supply terminals 60a and 70a, and the other electrode of the capacitor Q is electrically connected to each of the ground terminals 60b and 70b, so that the capacitor Q functions as a decoupling capacitor which reduces noise in the power supply terminals 60a and 70a.

The present embodiment is not limited to the above.

Figure 6:
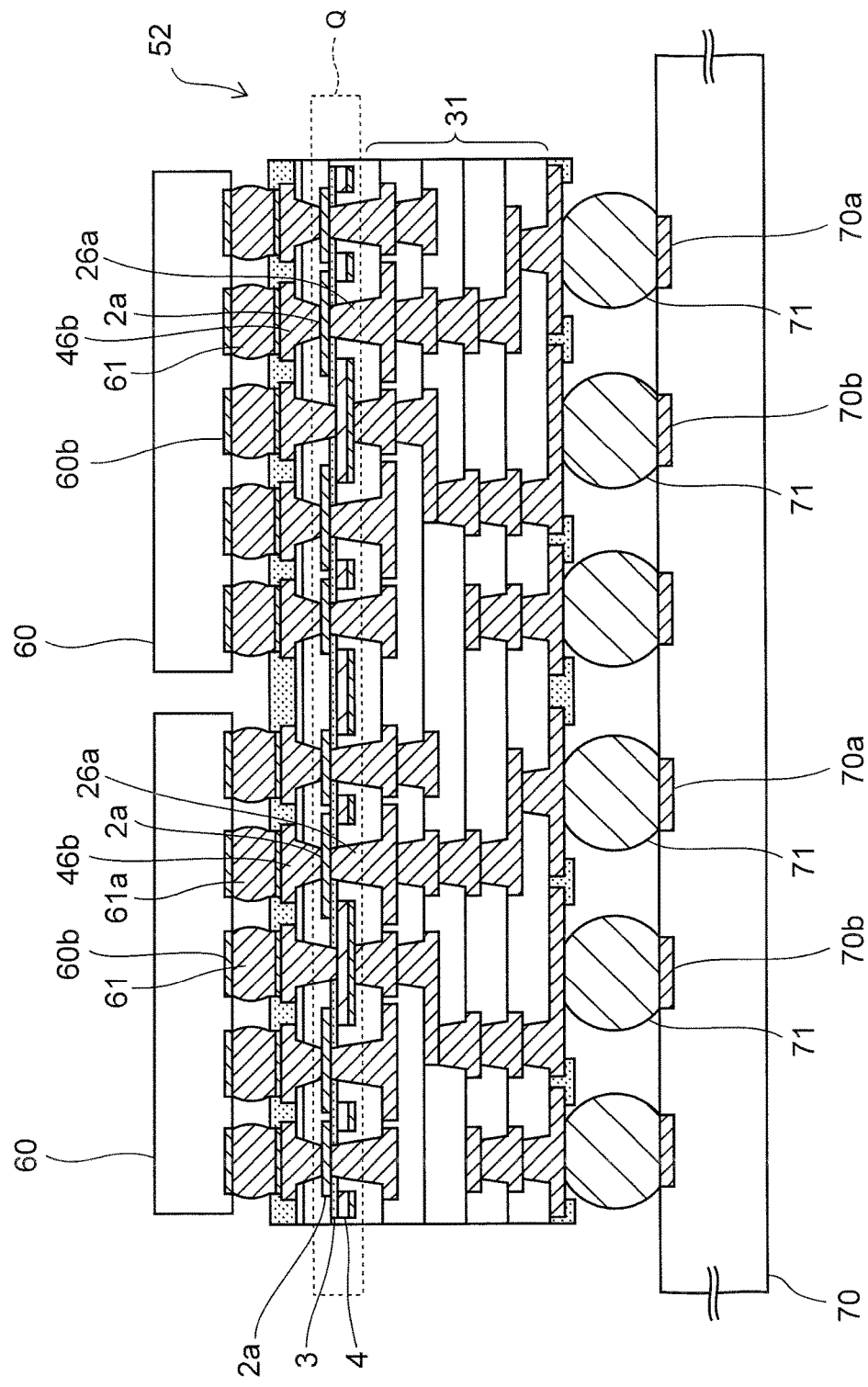
FIG. 6 is a cross-sectional view illustrating another example of method of using the wiring substrate according to the first embodiment.

FIG. 6 is a cross-sectional view illustrating another method of using the wiring substrate 52. Note that, in FIG. 6, the same elements as those in in FIG. 5 are given with the same reference numerals as in FIG. 5, and the description thereof will be omitted below.

In the example of FIG. 6, a plurality of the semiconductor elements 60 are mounted onto the wiring substrate 52.

The power supply voltage of each semiconductor element 60 is not particularly limited.

In the present embodiment, the first conductor pattern 2a is divided into the regions A to D (see FIG. 3A) of different power supply voltages. Therefore, by allocating one semiconductor element 60 to each of the regions A to D, the respective semiconductor elements 60 can be driven at the different power supply voltages.

Second Embodiment

Figure 7:
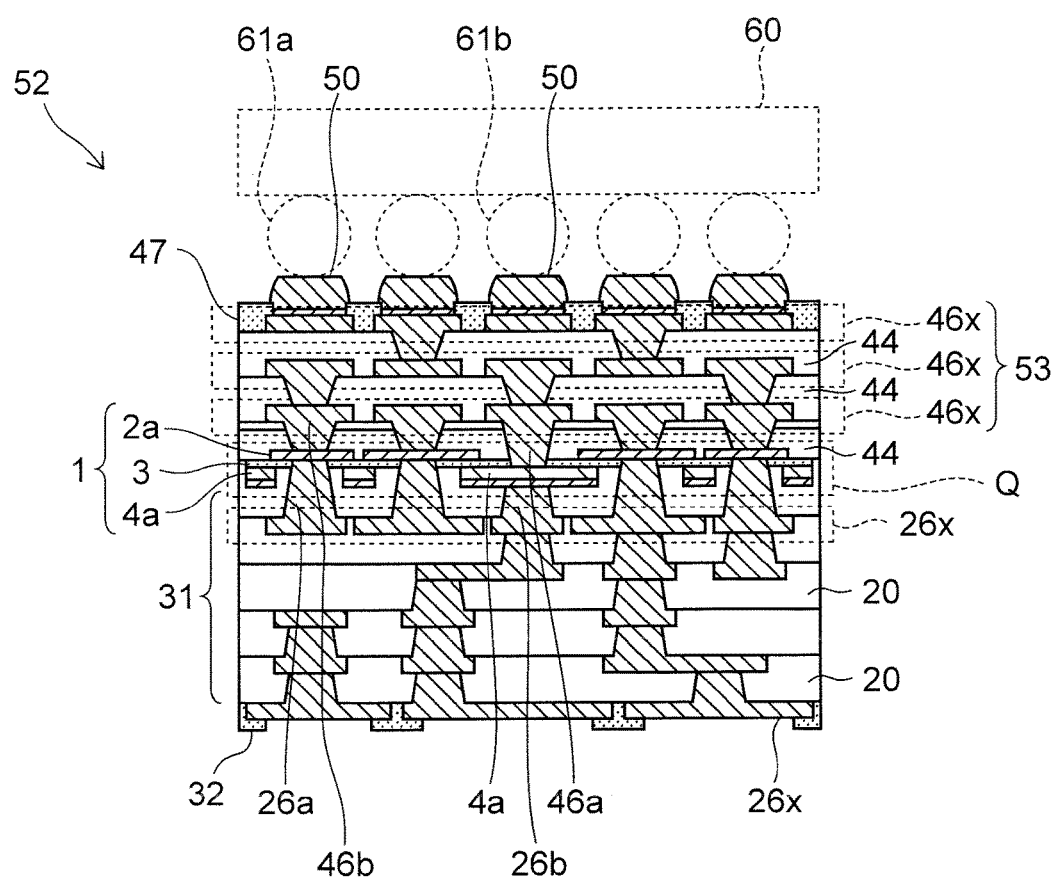
FIG. 7 is a cross-sectional view of a wiring substrate according to a second embodiment.

FIG. 7 is a cross-sectional view of a wiring substrate according to the present embodiment.

Note that, in FIG. 7, the same elements as those in in the first embodiment are given with the same reference numerals as in the first embodiment, and the description thereof will be omitted below.

As illustrated in FIG. 7, in the wiring substrate 52 according to the present embodiment, by the build-up method in which a plurality of layers of the second insulating layer 44 and the second wiring layer 46x are formed, a second multilayer wiring layer 53 is formed on the respective via conductors 46a and 46b.

According to this structure, the first multilayer wiring layer 31 and the second multilayer wiring layer 53 are respectively formed on both surfaces of the capacitor Q, so that the density of the wirings in the wiring substrate 52 can be increased.

Note that the number of layers in each of the first multilayer wiring layer 31 and the second multilayer wiring layer 53 is not particularly limited.

However, it is preferable to make the capacitor Q to be closer to the semiconductor element 60, by employing such a structure where the number of the second wiring layers 46x in the second multilayer wiring layer 53 is smaller than the number of the second wiring layers 26x in the first multilayer wiring layer 31. This structure shortens a wiring length from the capacitor Q to the semiconductor element 60, so that a signal delay due to the wiring length is suppressed, and an effect of the decoupling by the capacitor Q can be increased.

Third Embodiment

Figure 8:
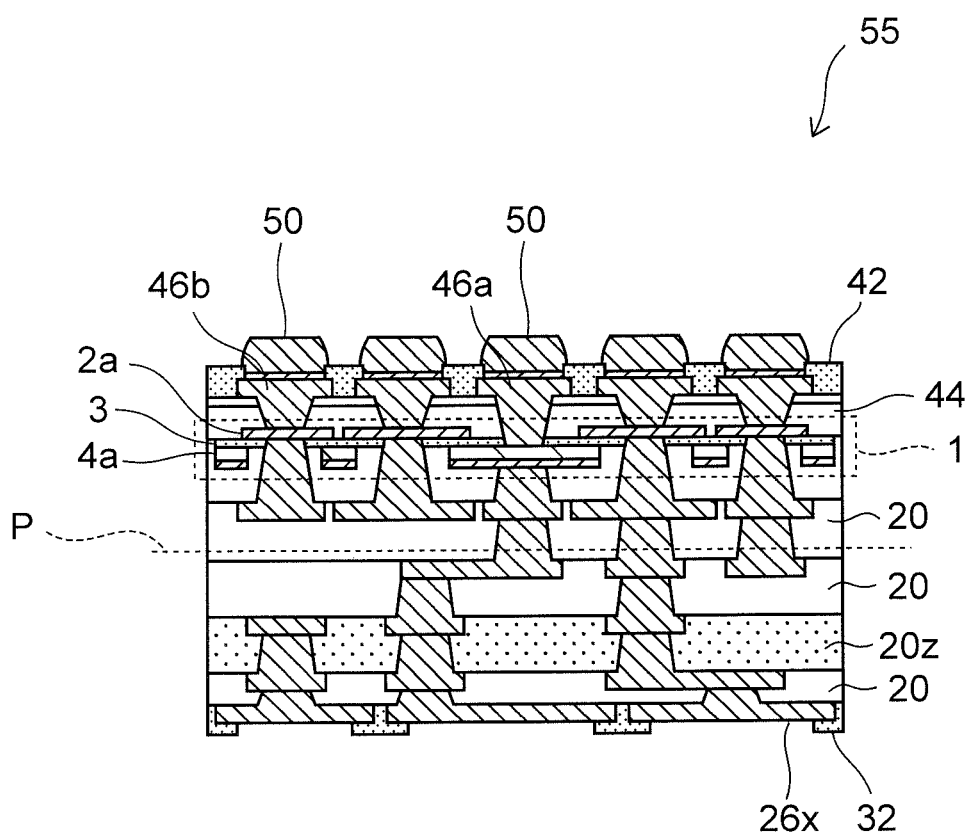
FIG. 8 is a cross-sectional view of a wiring substrate according to a third embodiment.

FIG. 8 is a cross-sectional view of a wiring substrate according to the present embodiment.

Note that, in FIG. 8, the same elements as those in in the first and second embodiments are given with the same reference numerals as in these embodiments, and the description thereof will be omitted below.

As illustrated in FIG. 8, in a wiring substrate 55 according to the present embodiment, a glass cloth-containing epoxy resin is used as a material of one insulating layer 20z among the plurality of the first insulating layers 20. This results in the higher Young's modulus of the first insulating layer 20z than that of the other first insulating layers 20 with no glass cloth.

In addition, the number of the first insulating layers 20 which are laminated under the first insulating layer 20z is one, which is the same as the number of the second insulating layers 44 which are laminated on the laminated sheet 1.

As described above, the second conductor pattern 4a of the laminated sheet 1 also uses nickel having a high Young's modulus as a material. Therefore, in the present embodiment, the laminated sheet 1 and the first insulating layer 20z both having a high Young's modulus are disposed so as to be approximately linearly symmetrical with each other with respect to a center line P of the substrate. This structure can reinforce the wiring substrate 55 from the upper and lower sides in good balance by the laminated sheet 1 and the second insulating layer 20z, and effectively suppress warpage of the wiring substrate 55.

Although the respective embodiments are described in details in the foregoing, the respective embodiments are not limited to the above.

Although the inorganic dielectric layer 3 of the laminated sheet 1 is used as a capacitor dielectric layer in the above, the intended use of the inorganic dielectric layer 3 is not limited to this. For example, the inorganic dielectric layer 3 may be used as the first insulating layer 20 constituting the first multilayer wiring layer 31 or the second insulating layer 44 constituting the second multilayer wiring layer 53, thereby obtaining the thin wiring substrate 52.

In addition, although the aforementioned wiring substrate 52 is a coreless substrate, the present embodiments may be applied to a wiring substrate provided with a core base member to form the thin inorganic dielectric layer 3 on the wiring substrate.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A wiring substrate comprising:
   a laminated sheet including a first conductor pattern, an inorganic dielectric layer, and a second conductor pattern being laminated in this order, the first conductor pattern being divided into a plurality of regions;
   a first multilayer wiring layer formed over the first conductor pattern of the laminated sheet, and provided with at least one layer of either one of a first wiring layer and a first insulating layer;
   a second multilayer wiring layer formed over the second conductor pattern of the laminated sheet, and provided with at least one layer of either one of a second wiring layer and a second insulating layer;

a first via conductor connecting any of the first wiring layers in the first multilayer wiring layer to the first conductor pattern of the laminated sheet;

a second via conductor connecting any of the second wiring layers in the second multilayer wiring layer to the first conductor pattern of the laminated sheet;

a third via conductor connecting any of the first wiring layers in the first multilayer wiring layer to the second conductor pattern of the laminated sheet; and a fourth via conductor connecting any of the second wiring layers in the second multilayer wiring layer to the second conductor pattern of the laminated sheet, wherein the first conductor pattern is interposed between the first via conductor and the second via conductor, and the second conductor pattern is interposed between the third via conductor and the fourth via conductor.

2. The wiring substrate according to claim 1, wherein the second conductor pattern has a Young's modulus higher than a Young's modulus of the first conductor pattern.

3. The wiring substrate according to claim 1, wherein
the first via conductor is electrically connected to a first power supply terminal of a semiconductor element provided over the first conductor pattern,
the second via conductor is electrically connected to a second power supply terminal of a circuit substrate provided over the second conductor pattern,
the third via conductor is electrically connected to a first ground terminal of the semiconductor element, and
the fourth via conductor is electrically connected to a second ground terminal of the circuit substrate.

4. The wiring substrate according to claim 1, wherein the number of the first wiring layers in the first multilayer wiring layer is less than the number of the second wiring layers in the second multilayer wiring layer.

5. The wiring substrate according to claim 1, wherein one of the second insulating layers has a Young's modulus higher than each of a Young's modulus of the other second insulating layers,
and the number of the second insulating layers laminated under the one second insulating layer is the same as the number of the first insulating layers on the laminated sheet.

6. The wiring substrate according to claim 1, further comprising:
a conductor layer formed on the second conductor pattern, wherein the fourth via conductor is connected to the conductor layer.

7. The wiring substrate according to claim 6, wherein a material of the conductor layer is copper.

8. The wiring substrate according to claim 1, wherein
a material of the second conductor pattern is nickel, and
a material of the inorganic dielectric layer is any of barium titanate, strontium titanate, lead zirconate titanate, lead lanthanum zirconate titanate, lead niobium zirconate titanate, lead calcium zirconate titanate, lead strontium zirconate titanate, and tantalum oxide.

9. The wiring substrate according to claim 1, wherein
the second conductor pattern is formed by patterning the conductor layer with a mirror polished surface, and
the inorganic dielectric layer is formed on the surface of the conductor layer.

10. The wiring substrate according to claim 1, wherein the first conductor pattern, the inorganic dielectric layer, and the second conductor pattern form a capacitor.

* * * * *